(12) United States Patent
Johansson et al.

(10) Patent No.: US 8,741,011 B2
(45) Date of Patent: Jun. 3, 2014

(54) COATED CUTTING TOOL FOR METAL CUTTING APPLICATIONS GENERATING HIGH TEMPERATURES

(75) Inventors: Mats Johansson, Linköping (SE); Lina Rogström, Linköping (SE); Lars Johnson, Linköping (SE); Magnus Odén, Tullinge (SE); Lars Hultman, Linköping (SE)

(73) Assignee: Sandvik Intellectual Property AB, Sandviken (SE)

( * ) Notice: Subject to any disclaimer, the term of this patent is extended or adjusted under 35 U.S.C. 154(b) by 255 days.

(21) Appl. No.: 13/259,935

(22) PCT Filed: Jun. 9, 2009

(86) PCT No.: PCT/SE2009/050697
§ 371 (c)(1),
(2), (4) Date: Jan. 19, 2012

(87) PCT Pub. No.: WO2010/114448
PCT Pub. Date: Oct. 7, 2010

(65) Prior Publication Data
US 2012/0114442 A1    May 10, 2012

(30) Foreign Application Priority Data
Apr. 3, 2009    (SE) ...................................... 0900443

(51) Int. Cl.
*B23B 27/14*    (2006.01)
*C23C 14/06*    (2006.01)

(52) U.S. Cl.
CPC ........... *B23B 27/148* (2013.01); *C23C 14/0641* (2013.01)
USPC ..................... 51/307; 204/192.1; 204/192.15; 204/192.16; 51/309; 407/119; 428/325; 428/336; 428/697; 428/698; 428/699; 428/704

(58) Field of Classification Search
CPC ...... B23B 27/14; B23B 27/148; C04B 41/87; C23C 14/06; C23C 14/0641
USPC ........... 51/307, 309; 428/325, 336, 697, 698, 428/699, 701, 702, 704; 407/119
See application file for complete search history.

(56) References Cited

U.S. PATENT DOCUMENTS 5,879,823 A * 3/1999 Prizzi et al. .................... 428/697
6,506,999 B2 * 1/2003 dos Santos Pereira Ribeiro .......................... 428/698

(Continued)

FOREIGN PATENT DOCUMENTS

EP    448720    * 10/1991
EP    603486    * 6/1994

(Continued)

OTHER PUBLICATIONS

Lamni et al "Microstructure and nanohardness properties of Zr-Al-N and Zr-Cr-N thin films" J.Vac.Sci. Tech A 23 (4) Jul./Aug. 2005 p. 593-598.*

(Continued)

*Primary Examiner* — Archene Turner
(74) *Attorney, Agent, or Firm* — Morgan, Lewis & Bockius LLP

(57) ABSTRACT

The present invention relates to a cutting tool insert comprising a body of cemented carbide, cermet, ceramics, high speed steel (HSS), polycrystalline diamond (PCD) or polycrystalline cubic boron nitride (PCBN), a hard and wear resistant coating is applied, grown by physical vapour deposition (PVD) such as cathodic arc evaporation or magnetron sputtering. Said coating comprises at least one layer of $(Zr_xAl_{1-x})N$ with of $0.45 < x < 0.85$ and $0.90 \leq y < 1.30$ with a thickness between 0.5 and 10 µm. Said layer has a nanocrystalline microstructure consisting of a single cubic phase or a mixture of hexagonal and cubic phases. The insert is particularly useful in metal cutting applications generating high temperatures with improved crater wear resistance.

20 Claims, 3 Drawing Sheets

(56) References Cited

U.S. PATENT DOCUMENTS

| | | |
|---|---|---|
| 8,206,812 B2 | 6/2012 | Selinder et al. |
| 2007/0111032 A1 | 5/2007 | Nagano et al. |
| 2008/0166580 A1 | 7/2008 | Selinder et al. |
| 2009/0130434 A1* | 5/2009 | Zhu et al. ............. 407/119 |

FOREIGN PATENT DOCUMENTS

| | | |
|---|---|---|
| EP | 1 785 504 A2 | 5/2007 |
| EP | 1 935 999 A2 | 6/2008 |
| JP | 4-017644 | 1/1992 |
| JP | 4-21760 | 1/1992 |
| JP | 2008-162008 | 7/2008 |
| JP | 2008-168421 | 7/2008 |
| WO | 2009/151386 A1 | 12/2009 |

OTHER PUBLICATIONS

Hasegawa et al "Effects of AL contents on microstructures of Cr(1-x)Al(x)N and Zr(1-x)Al(x)N films synthesized by cathodic arc method" Surfce & Coatings Tech 200 20015 p. 2409-2413.*

Dejun "Synthesis of ZrAlN coatings with thernal stability at high temperatues" Science in China Series E: Tech Sci 2006 vol. 49, No. 5 p. 576-581.*

International Search Report mailed on Feb. 17, 2010 in International Application No. PCT/SE2009/050697 filed Jun. 9, 2009.

Written Opinion for International Application No. PCT/SE2009/050697, dated Feb. 17, 2010.

Notification of the First Office Action (with English translation) for Chinese Patent Application No. 200980158531.0, dated Feb. 17, 2013.

English translation of Notice of Reasons for Rejection for Japanese Patent Application No. 2012-503362, dated Jun. 25, 2013.

Hiroyuki Hasegawa, et al., "*Effects of second metal contents on microstructure and micro-hardness of ternary nitride films synthesized by cathodic arc method*," Surface & Coatings Technology 188-189(2004), pp. 234-240.

D. Rafaja, et al., "*Formation of defect structures in hard nanocomposites*," Surface & Coatings Technology 203 (2008), pp. 572-578.

* cited by examiner

COATED CUTTING TOOL FOR METAL CUTTING APPLICATIONS GENERATING HIGH TEMPERATURES

CROSS REFERENCE TO RELATED APPLICATIONS:

This application is a §371 National Stage Application of PCT International Application No. PCT/SE2009/050697, filed Jun. 9, 2009, and claims priority under 35 U.S.C. §119 and/or §365 to Swedish Application No. 0900443-3 filed Apr. 3, 2009, both of which are herein incorporated by reference in their entirety.

BACKGROUND OF THE INVENTION

The present invention relates to a cutting tool insert for machining by chip removal and wear resistant coating comprising at least one (Zr,Al)N layer with high Zr content grown by physical vapour deposition (PVD) and preferably by cathodic arc evaporation or magnetron sputtering. This insert is particularly useful in metal cutting applications generating high temperatures, e.g., machining of steel, stainless steel and hardened steel.

$Zr_{1-x}Al_xN$ ($0 \leq x \leq 1.0$) layers have been synthesized by the cathodic arc evaporation using alloyed and/or metal cathodes, H. Hasegawa et al, Surf. Coat. Tech. 200 (2005). The peaks of $Zr_{1-x}Al_xN$ (x=0.37) showed a NaCl structure that changed to a wurtzite structure at x=0.50.

EP 1 785 504 discloses a surface-coated base material and a high hardness coating formed on or over said base material. Said high hardness coating comprises a coating layer containing a nitride compound with Al as main component and at least one element selected from the group consisting of Zr, Hf, Pd, Ir and the rare earth elements.

JP 04-017664 discloses a gradient layer consisting of at least one kind among the carbide, nitride and carbonitride of $Zr_xAl_{1-x}$ ($0.5 \leq x \leq 1.0$) in which the Al concentration is continuously or stepwise changed from the interface with the base material toward the surface of the layer.

EP 1 935 999 discloses a cemented carbide end-milling tool with a wear resistant coating. The wear resistant coating comprises a first layer of a PVD AlMe nitride or carbonitride where Me is Zr, V, Nb, Cr or Ti with an atomic fraction of Al to Me between 1.20 and 1.50 and a second layer of PVD AlMe nitride or carbonitride where Me is Zr, V, Nb, Cr or Ti with an atomic fraction of Al to Me between 1.30 and 1.70.

The trends towards dry-work processes for environmental protection, i.e., metal cutting operation without using cutting fluids (lubricants) and accelerated machining speed with improved process put even higher demands on the characteristics of the tool materials due to an increased tool cutting-edge temperature. In particular, coating stability at high temperatures, e.g., oxidation- and wear-resistance, has become even more crucial.

It is an object of the present invention to provide a coated cutting tool insert with improved performance in metal cutting applications at elevated temperatures.

It has been found that a high Zr content in superstoichiometric (Zr,Al)N layers leads to improved high temperature properties and in particular improved crater wear resistance during metal cutting.

DETAILED DESCRIPTION OF THE INVENTION

Figure 1:
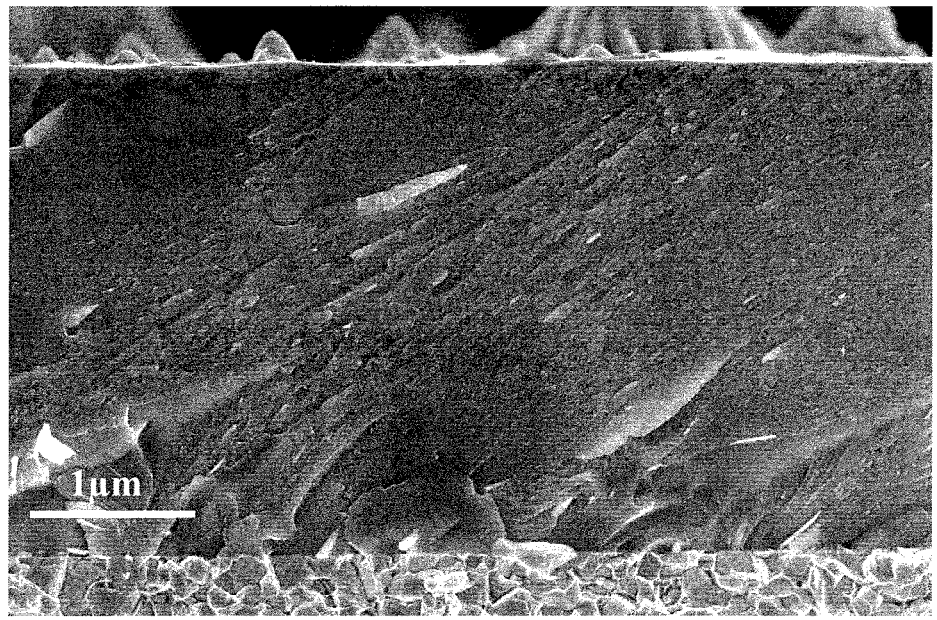
FIG. 1; A scanning electron microscope (SEM) micrograph of a fractured (Al,Zr)N layer.

According to the present invention, there is provided a cutting tool for machining by chip removal comprising a body of a hard alloy of cemented carbide, cermet, ceramics, high speed steel (HSS), polycrystalline diamond (PCD) or polycrystalline cubic boron nitride (PCBN), preferably cemented carbide and cermet, onto which a wear resistant coating is deposited comprising at least one $(Zr_xAl_{1-x})N_y$ layer with $0.45 < x < 0.85$, preferably $0.50 < x < 0.75$, and $0.90 \leq y < 1.30$, preferably $1.00 < y < 1.25$, more preferably $1.00 < y < 1.20$, as determined by, e.g., EDS or WDS techniques, consisting of a single cubic phase or a single hexagonal phase or a mixture thereof, preferably a mixture of cubic and hexagonal phases with predominantly cubic phase, as determined by X-ray diffraction. The elemental composition, x and y, is, within the measurement accuracy, preferably with a variation less than 10% throughout the layer. Variation of the composition may also occur due to normal process variations during deposition such as, e.g., rotation of the insert holder during deposition.

Said layer is 0.5 to 10 gµ, preferably 0.5 to 5 µm thick, and has a nanocrystalline microstructure with an average crystallite size of <100 nm, preferably <50 nm, most preferably <25 nm, as determined by high resolution cross sectional transmission electron microscopy of a middle region of the layer, i.e., a region within 30 to 70% of the thickness in the growth direction. Said average crystallite size is the average from measuring the size of at least ten adjacent crystallites.

Said as-deposited (Zr,Al)N layer with its nanocrystalline structure has a hardness >23 GPa and preferably <35 GPa.

The body may further be coated with an inner single- and/or multilayer coating of, preferably TiN, TiC, Ti(C,N) or (Ti,Al)N, most preferably TiN or (Ti,Al)N, and/or an outer single- and/or multilayer coating of, preferably TiN, TiC, Ti(C,N), (Ti,Al)N or oxides, most preferably TiN or (Ti,Al)N, to a total coating thickness, including the (Zr,Al)N layer, of 0.7 to 20 preferably 1 to 10 µm, and most preferably 2 to 7 µm.

In one embodiment, (Zr,Al)N is deposited by cathodic arc evaporation from cathodes resulting in the desired layer composition, preferably by evaporation of an alloyed cathode, at the following conditions: an evaporation current between 50 and 200 A, a bias between 0 and −300 V, preferably between −10 and −150 V, and a temperature between 200 and 800° C., preferably between 300 and 600° C., in a mixed Ar+$N_2$ atmosphere, preferably in pure $N_2$, and at a total pressure between 1.0 and 7.0 Pa, preferably between 1.5 and 4.0 Pa.

In a second embodiment, (Zr,Al)N is deposited by magnetron sputtering from targets resulting in the desired layer composition, preferably by sputtering from an alloyed or composite target, at the following conditions: a power density applied to the sputter cathode between 0.5 and 15 W/cm², preferably between 1 and 5 W/cm², a bias between 0 and −300 V, preferably between −10 and −150 V, and a temperature between 200 and 800° C., preferably between 300 and 600°

C., in a mixed Ar+N$_2$ or pure N$_2$ atmosphere and at a total pressure between 0.1 and 7.0 Pa, preferably between 0.1 and 2.5 Pa.

The invention also relates to the use of cutting tool inserts according to the above for machining of steel, stainless steel and hardened steel at cutting speeds of 50-500 m/min, preferably 75-400 m/min, with an average feed, per tooth in the case of milling, of 0.08-0.5 mm, preferably 0.1-0.4 mm, depending on cutting speed and insert geometry.

Example 1

Cemented carbide inserts with composition 94 wt % WC-6 wt % Co (fine grained) were used.

Before deposition, the inserts were cleaned according to standard practice. The system was evacuated to a pressure of less than 0.08 Pa, after which the inserts were sputter cleaned with Ar ions. Single $(Zr_xAl_{1-x})N_y$ layers were grown using cathodic arc evaporation using alloyed (Zr,Al) cathodes. The layers were grown at 400° C., in pure N$_2$ atmosphere at a total pressure of 2.5 Pa, using a bias of −100 V and an evaporation current between 100 A and 200 A to a total thickness of 3 μm, resulting in layer compositions according to table 1.

FIG. 1 shows a SEM micrograph of a typical layer in (fractured) cross-section according to the invention with a glassy appearance common for nanocrystalline structures.

The metal composition, x, of the $(Zr_xAl_{1-x})N_y$ layers was obtained by energy dispersive spectroscopy (EDS) analysis area using a LEO Ultra 55 scanning electron microscope with a Thermo Noran EDS. Industrial standards and ZAF correction were used for the quantitative analysis and evaluated using a Noran System Six (NSS version 2) software (see table 1).

The nitrogen content, y, for some of the $(Zr_xAl_{1-x})N_y$ layers was obtained by Time of Flight Elastic Recoil Detection Analysis (ERDA) using an incident 40 MeV Iodine ion beam. From the elemental depth profiles achieved the y-value was calculated using data down to a depth of 300 nm in the layer (see table 1).

TABLE 1

| Layer | x | y |
|---|---|---|
| 1 | 1.00 | — |
| 2 | 0.83 | — |
| 3 | 0.83 | 1.00 |
| 4 | 0.81 | — |
| 5 | 0.74 | — |
| 6 | 0.70 | 1.09 |
| 7 | 0.67 | — |
| 8 | 0.52 | — |
| 9 | 0.50 | 1.20 |
| 10 | 0.50 | — |
| 11 | 0.35 | — |
| 12 | 0.35 | 1.27 |
| 13 | 0.40 | — |
| 14 | 0.34 | — |
| 15 | 0.26 | 1.20 |
| 16 | 0.24 | — |

In order to simulate age hardening, i.e., an increased hardening effect of the coating with time, accelerated test conditions were used by conducting controlled isothermal heat treatments of the inserts in inert Ar atmosphere up to 1200° C. for 120 min. Also, this is the typical temperature close to the cutting edge of the insert during metal machining.

Figure 2:
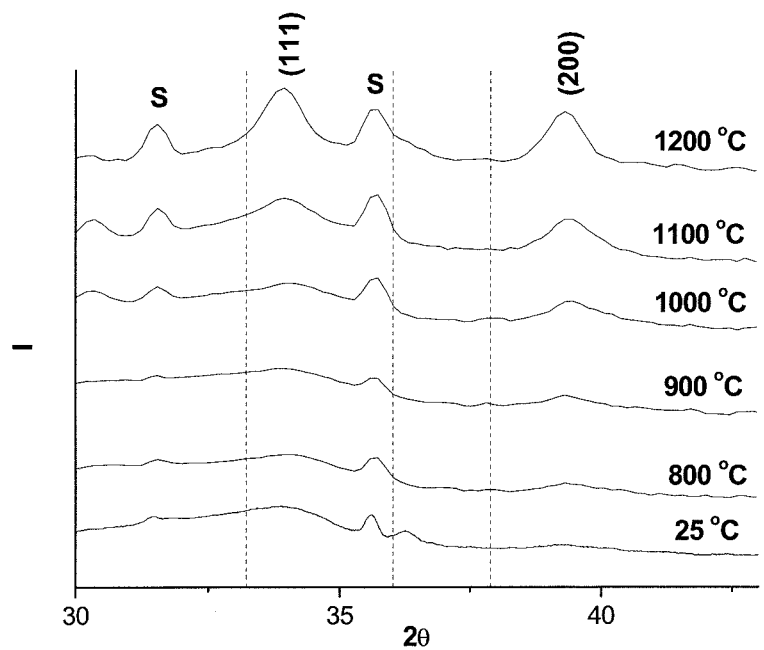
FIG. 2; X-ray diffraction patterns vs. heat treatment temperature.

The XRD patterns of the as-deposited layers and heat treated layers were obtained using Cu K alpha radiation and a θ-2θ configuration. The layer peaks, typically, are rather broad characteristic of a nanocrystalline structure. Moreover, the fraction of the cubic phase increases with increasing heat treatment temperatures and observed by more well defined diffraction peaks. As an example, FIG. 2 shows the XRD result of a the $(Zr_{0.67}Al_{0.33})N$ layer as a function of heat treatment temperature where the cubic phase is indexed with (111) and (200), the insert with (S) and the hexagonal phase with dotted lines. As apparent from the figure, the as-deposited layer (marked with 25° C.) show a mixture of nanocrystalline hexagonal and cubic structured (Zr,Al)N.

Figure 3:
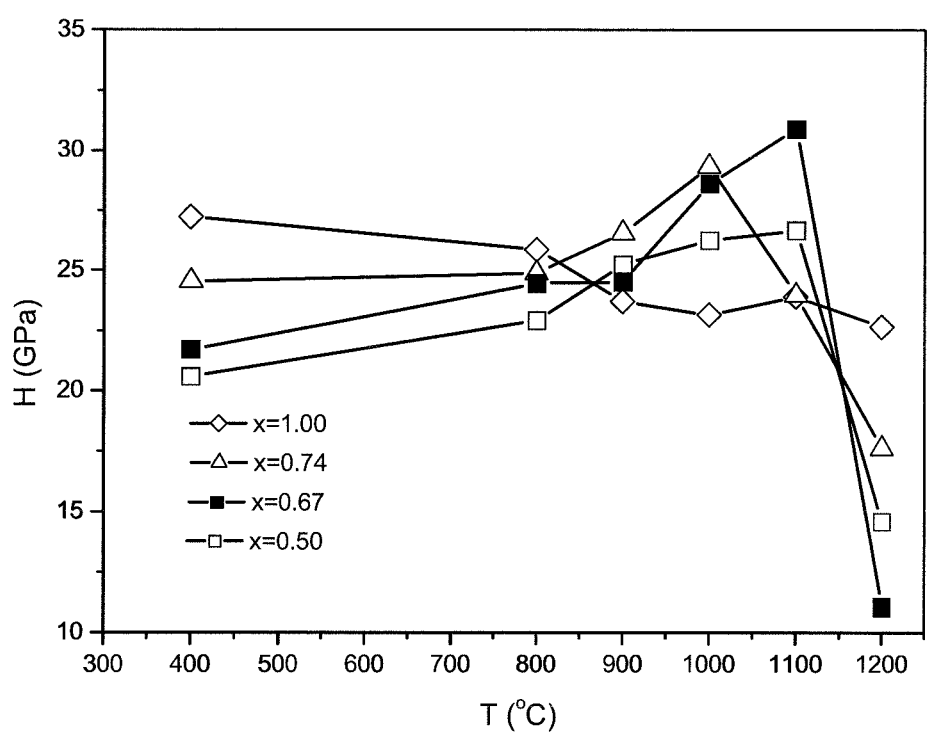
FIG. 3; Hardness vs. heat treatment temperature and composition, x in $(Zr_xAl_{1-x})N$.

Hardness data was estimated by the nanoindentation technique of the layers using a UMIS nanoindentation system with a Berkovich diamond tip and a maximum tip load of 25 mN. Indentations were made on polished surfaces. FIG. 3 shows the hardness (H) of $(Zr_xAl_{1-x})N$ layers as a function of heat treatment and composition, x. For x>0.50, an unexpected increase of the age hardening is obtained. Specifically, the increase in hardness for x=0.67 is more than 25%, i.e., with values from 25 to 33 GPa.

Figure 4:
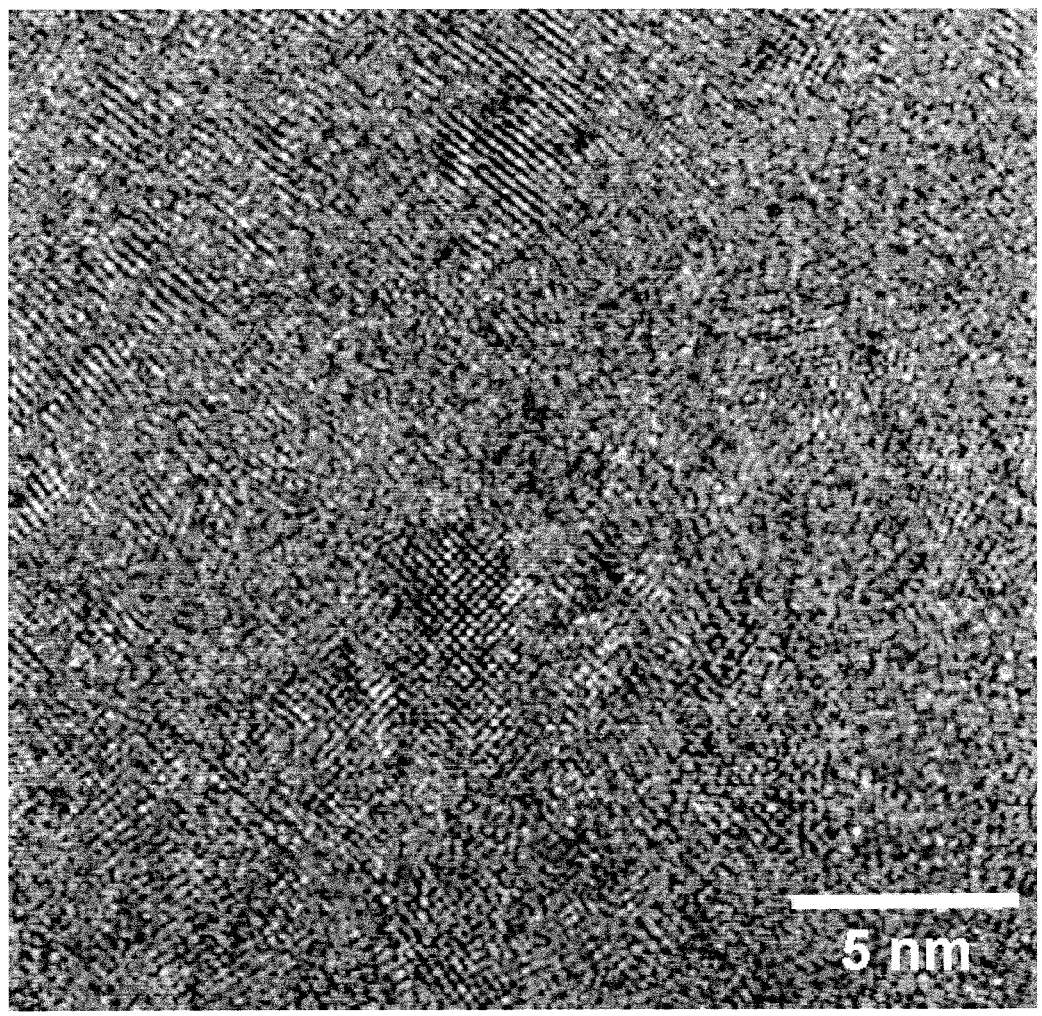
FIG. 4; A high resolution transmission electron microscope (TEM) cross sectional micrograph of a (Zr,Al)N layer.

Cross-sectional high resolution transmission electron microscopy (TEM) was used to study the microstructure of the layers with a FEI Technai G$^2$ TF 20 UT operated at 200 kV. The sample preparation comprised standard mechanical grinding/polishing and ion-beam sputtering. FIG. 4 shows that the layer exhibits a nanocrystalline microstructure with an average crystallite size of <25 nm.

Example 2

Inserts from example 1 were tested according to:
Geometry: CNMA 120408-KR
Application: Longitudinal turning
Work piece material: SS1672
Cutting speed: 240 m/min
Feed: 0.2 mm/rev
Depth of cut: 2 mm
Crater wear was measured as the crater area in mm$^2$ after 5 min of turning with the following results.

TABLE 2

| Layer | X in $(Zr_xAl_{1-x})N$ | Crater Wear (mm$^2$) |
|---|---|---|
| 1 | 1.00 | — |
| 2 | 0.83 | — |
| 3 | 0.83 | <0.05 |
| 4 | 0.81 | — |
| 5 | 0.74 | — |
| 6 | 0.70 | — |
| 7 | 0.67 | <0.05 |
| 8 | 0.52 | — |
| 9 | 0.50 | <0.05 |
| 10 | 0.50 | — |
| 11 | 0.35 | — |
| 12 | 0.35 | 0.2 |
| 13 | 0.40 | — |
| 14 | 0.34 | — |
| 15 | 0.26 | — |
| 16 | 0.24 | 0.25 |

A crater wear <0.1 with the selected cutting data is satisfactory.

The invention claimed is:

1. A cutting tool insert comprising a body of cemented carbide, cermet, ceramics, high speed steel (HSS), polycrystalline diamond (PCD) or polycrystalline cubic boron nitride (PCBN), a hard and wear resistant coating is applied, said coating comprising at least one layer wherein said layer consists of $(Zr_xAl_{1-x})N_y$ with 0.50<x<0.75 and 1.00<y<1.25 with a thickness between 0.5 and 10 μm and a nanocrystalline microstructure consisting of a single cubic phase or a mixture of hexagonal and cubic phases, wherein an average crystallite size is less than 100 nm.

2. A cutting tool insert according to claim 1 wherein the average crystallite size is <50 nm.

3. A cutting tool insert according to claim 1 wherein $1.00<y<1.20$.

4. A cutting tool insert according to claim 1 wherein the elemental composition, x and y, has, within the measurement accuracy, a variation less than 10% throughout the layer.

5. A cutting tool insert according to claim 1 wherein said layer has a hardness >23 GPa.

6. A cutting tool insert according to claim 1 wherein said body includes an inner single- and/or multilayer coating of TiN, TiC, Ti(C,N) or (Ti,Al)N and/or an outer single- and/or multilayer coating of TiN, TiC, Ti(C,N), (Ti,Al)N or oxides, wherein a total coating thickness, including the $(Zr_xAl_{1-x})N_y$ layer, is 0.7 to 20 μm.

7. A method of making a cutting tool insert according to claim 1 comprising: depositing said $(Zr_xAl_{1-x})N_y$ layer by cathodic arc evaporation from cathodes yielding the desired layer composition with the following conditions: an evaporation current between 50 and 200 A, a bias between 0 and −300 V, and a temperature between 200 and 800° C., in a mixed Ar+N$_2$ atmosphere, and at a total pressure between 1.0 and 7.0 Pa.

8. A method of making a cutting tool insert according to claim 1 comprising: depositing said $(Zr_xAl_{1-x})N_y$ layer by magnetron sputtering from targets yielding the desired layer composition, with the following conditions: a power density applied to the sputter cathode between 0.5 and 15 W/cm$^2$, a bias between 0 and −300 V, and a temperature between 200 and 800° C., in a mixed Ar+N$_2$ atmosphere at a total pressure between 0.1 and 7.0 Pa.

9. A method of using a cutting tool insert according to claim 1 comprising: using the cutting tool for metal cutting applications in steel, stainless steel and hardened steel at cutting speeds of 50-500 m/min, with an average feed, per tooth, of 0.08-0.5 mm.

10. A cutting tool insert according to claim 1 wherein a thickness of the $(Zr_xAl_{1-x})N_y$ layer is between 0.5 and 5 μm.

11. A cutting tool insert according to claim 1 wherein said body has an inner single- and/or multilayer coating of TiN or (Ti,Al)N, and/or an outer single- and/or multilayer coating of TiN or (Ti,Al)N, and wherein a total coating thickness, including the $(Zr_xAl_{1-x})N_y$ layer, is 1 to 10 μm.

12. A method of making a cutting tool insert according to claim 1 comprising: depositing said $(Zr_xAl_{1-x})N_y$ layer by cathodic arc evaporation from cathodes yielding the desired layer composition, with the following conditions: an evaporation current between 50 and 200 A, a bias between 0 and −300 V, and a temperature between 200 and 800° C., in a pure N$_2$ atmosphere, and at a total pressure between 1.0 and 7.0 Pa.

13. A cutting tool insert comprising a body of cemented carbide, cermet, ceramics, high speed steel (HSS), polycrystalline diamond (PCD) or polycrystalline cubic boron nitride (PCBN), a hard and wear resistant coating is applied, said coating comprising at least one layer wherein said layer consists of $(Zr_xAl_{1-x})N_y$ with $0.50<x<0.75$ and $1.00<y<1.25$ with a thickness between 0.5 and 10 μm-and a nanocrystalline microstructure consisting of a single cubic phase or a mixture of hexagonal and cubic phases.

14. A cutting tool insert according to claim 13 wherein the elemental composition, x and y, has, within the measurement accuracy, a variation less than 10% throughout the layer.

15. A cutting tool insert according to claim 13 wherein said body includes an inner single- and/or multilayer coating of TiN, TiC, Ti(C,N) or (Ti,Al)N and/or an outer single- and/or multilayer coating of TiN, TiC, Ti(C,N), (Ti,Al)N or oxides, wherein a total coating thickness, including the $(Zr_xAl_{1-x})N_y$ layer, is 0.7 to 20 μm.

16. A cutting tool insert according to claim 13 wherein said body has an inner single- and/or multilayer coating of TiN or (Ti,Al)N, and/or an outer single- and/or multilayer coating of TiN or (Ti,Al)N, and wherein a total coating thickness, including the $(Zr_xAl_{1-x})N_y$ layer, is 1 to 10 μm.

17. A cutting tool insert according to claim 13 wherein said layer has a hardness >23 GPa.

18. A method of making a cutting tool insert according to claim 13 comprising: depositing said $(Zr_xAl_{1-x})N_y$ layer by cathodic arc evaporation from cathodes yielding the desired layer composition with the following conditions: an evaporation current between 50 and 200 A, a bias between 0 and −300 V, and a temperature between 200 and 800° C., in a mixed Ar+N$_2$ atmosphere, and at a total pressure between 1.0 and 7.0 Pa.

19. A method of making a cutting tool insert according to claim 13 comprising: depositing said $(Zr_xAl_{1-x})N_y$ layer by magnetron sputtering from targets yielding the desired layer composition, with the following conditions: a power density applied to the sputter cathode between 0.5 and 15 W/cm$^2$, a bias between 0 and −300 V, and a temperature between 200 and 800° C., in a mixed Ar+N$_2$ atmosphere at a total pressure between 0.1 and 7.0 Pa.

20. A method of making a cutting tool insert according to claim 13 comprising: depositing said $(Zr_xAl_{1-x})N_y$ layer by cathodic arc evaporation from cathodes yielding the desired layer composition, with the following conditions: an evaporation current between 50 and 200 A, a bias between 0 and −300 V, and a temperature between 200 and 800° C., in a pure N$_2$ atmosphere, and at a total pressure between 1.0 and 7.0 Pa.

* * * * *